(12) United States Patent
Takashima et al.

(10) Patent No.: US 10,295,605 B2
(45) Date of Patent: May 21, 2019

(54) STATE DETECTING METHOD AND STATE DETECTING DEVICE OF SECONDARY BATTERY

(71) Applicants: FURUKAWA ELECTRIC CO., LTD., Tokyo (JP); FURUKAWA AUTOMOTIVE SYSTEMS INC., Shiga (JP)

(72) Inventors: Naoya Takashima, Tokyo (JP); Noriyasu Iwane, Tokyo (JP); Koichi Yokoyama, Tokyo (JP); Shinichi Nomoto, Tokyo (JP)

(73) Assignees: FURUKAWA AUTOMOTIVE SYSTEMS INC., Shiga (JP); FURUKAWA ELECTRIC CO., LTD., Tokyo (JP)

( * ) Notice: Subject to any disclaimer, the term of this patent is extended or adjusted under 35 U.S.C. 154(b) by 806 days.

(21) Appl. No.: 14/835,710

(22) Filed: Aug. 26, 2015

(65) Prior Publication Data

US 2015/0362557 A1 Dec. 17, 2015

Related U.S. Application Data

(63) Continuation of application No. PCT/JP2014/053397, filed on Feb. 14, 2014.

(30) Foreign Application Priority Data

Mar. 7, 2013 (JP) ................................ 2013-045853

(51) Int. Cl.
*G01R 31/36* (2019.01)
*G01R 31/3842* (2019.01)
(Continued)

(52) U.S. Cl.
CPC ............ *G01R 31/3842* (2019.01); *B60L 3/12* (2013.01); *B60L 58/12* (2019.02); *B60L 58/21* (2019.02);
(Continued)

(58) Field of Classification Search
CPC ..... G01R 31/44; B60L 11/1861; H01M 10/48
See application file for complete search history.

(56) References Cited

U.S. PATENT DOCUMENTS 5,606,240 A 2/1997 Kokuga
6,300,763 B1 * 10/2001 Kwok ................ G01R 31/3651
320/132

(Continued)

FOREIGN PATENT DOCUMENTS

JP 6-315234 A 11/1994
JP H06-315234 A 11/1994
(Continued)

OTHER PUBLICATIONS

Chinese Office Action with its English translation for Chinese Patent Application No. 201480012318.X dated May 22, 2017.
(Continued)

*Primary Examiner* — Jermele M Hollington
*Assistant Examiner* — Alvaro E Fortich
(74) *Attorney, Agent, or Firm* — Kenichiro Yoshida (57) ABSTRACT

A state detecting method and device of a secondary battery correct impact resulting from state quantities caused by variation and calculate a state of charge with high accuracy. The state detecting method includes a first step of acquiring a detected voltage value and a detected current value, a second step of acquiring state quantities caused by variation such as a detected temperature value, a third step of determining if the detected voltage value is the voltage threshold value or greater, a fourth step of determining if the detected
(Continued)

current value is the current threshold value or less, a fifth step of determining if a duration time of the current threshold value or less has elapsed a determination time, a sixth step of setting a state of charge in a reference state as the state of charge, and a seventh step of correcting the state of charge in the reference state.

11 Claims, 7 Drawing Sheets

(51) Int. Cl.
| | |
|---|---|
| H01M 10/48 | (2006.01) |
| H01M 10/44 | (2006.01) |
| B60L 3/12 | (2006.01) |
| G01R 31/44 | (2006.01) |
| B60L 58/12 | (2019.01) |
| B60L 58/21 | (2019.01) |
| H02J 7/00 | (2006.01) |

(52) U.S. Cl.
CPC ......... *G01R 31/3648* (2013.01); *G01R 31/44* (2013.01); *H01M 10/44* (2013.01); *H01M 10/48* (2013.01); *B60L 2240/545* (2013.01); *B60L 2240/547* (2013.01); *B60L 2240/549* (2013.01); *B60L 2260/42* (2013.01); *B60L 2260/44* (2013.01); *H01M 10/443* (2013.01); *H01M 10/486* (2013.01); *H02J 7/0047* (2013.01); *H02J 2007/0049* (2013.01); *Y02T 10/7005* (2013.01); *Y02T 10/7044* (2013.01); *Y02T 10/7061* (2013.01)

(56) References Cited

U.S. PATENT DOCUMENTS

| | | | |
|---|---|---|---|
| 2002/0036482 A1 | 3/2002 | Nakatsuji | |
| 2003/0195719 A1* | 10/2003 | Emori | B60W 10/26 702/183 |
| 2005/0212438 A1* | 9/2005 | Senda | H02J 7/1423 315/77 |
| 2009/0167252 A1* | 7/2009 | Abe | H01M 10/425 320/152 |
| 2010/0019727 A1* | 1/2010 | Karden | B60L 11/1861 320/129 |
| 2010/0244886 A1* | 9/2010 | Kawahara | G01R 31/361 324/764.01 |
| 2010/0247988 A1* | 9/2010 | Okumura | B60K 6/365 429/90 |
| 2012/0022732 A1* | 1/2012 | Taspinar | B60L 7/10 701/22 |
| 2012/0074904 A1* | 3/2012 | Rutkowski | H01M 10/44 320/112 |
| 2012/0086406 A1* | 4/2012 | Maeagawa | H02J 7/008 320/162 |
| 2013/0021004 A1 | 1/2013 | Nomoto | |
| 2013/0154544 A1* | 6/2013 | Yokoyama | G01R 31/3624 320/105 |
| 2015/0028815 A1* | 1/2015 | Osawa | H01M 10/44 320/134 |

FOREIGN PATENT DOCUMENTS

| | | |
|---|---|---|
| JP | H09-163624 A | 6/1997 |
| JP | 2001-126773 A | 5/2001 |
| JP | 2002-058171 A | 2/2002 |
| JP | 2002-58171 A | 2/2002 |
| JP | 2010-284038 A | 12/2010 |
| JP | 2011-163789 A | 8/2011 |
| JP | 2012-141258 A | 7/2012 |

OTHER PUBLICATIONS

Japanese Office Action with its English translation for Japanese Patent Application No. 2013-045853 dated Sep. 21, 2016.
International Search Report for International Patent Application No. PCT/JP2014/053397 dated May 20, 2014.
Japanese Office Action with its English translation for Japanese Patent Application No. 2013-045853 dated Jul. 24, 2015.
Japanese Office Action with its English translation for Japanese Patent Application No. 2013-045853 dated Mar. 4, 2016.

* cited by examiner

STATE DETECTING METHOD AND STATE DETECTING DEVICE OF SECONDARY BATTERY

TECHNICAL FIELD

The present invention relates to a method and a device for detecting a state of a secondary battery, and more specifically to a state detecting method and a state detecting device of a secondary battery that detect that the secondary battery has reached a chargeable upper limit and estimate the state of charge.

BACKGROUND

A secondary battery is conventionally charged using a method in which a constant current charge is conducted until a terminal voltage of the secondary battery reaches a predetermined voltage value, and then switched to a constant voltage charge after a predetermined voltage value has been reached. According to the above method, during the constant voltage charge after the predetermined voltage value has been reached, the secondary battery is determined to be fully charged when a predetermined time has elapsed after the moment a charge current at predetermined current value (current threshold value) or less is detected.

According to the above-described method for determining a full charge, if a secondary battery that is fully or nearly fully charged is charged, a charge current being the threshold value or lower is detected immediately after charging is started and, after a predetermined time has elapsed since that moment, the secondary battery is determined to be fully charged. However, the problem arises that, regardless of the battery already being fully charged before the elapse of the predetermined time, the full charge cannot be determined until the predetermined time elapses. Hence, according to Patent Document 1, the full charge is determined before the elapse of the predetermined time when the initial charge current is a current threshold value or less by switching the method for determining a full charge according to an initial determination result of the charge current value after charging is started.

Further, Patent Document 2 discloses a method for detecting a state of charge at a charge acceptance limit, which is an upper limit of the state of charge chargeable to the secondary battery. Here, the prior art determines if conditions are satisfied, the conditions being a measured temperature value higher than a predetermined temperature threshold value, a measured voltage value higher than a voltage threshold value, an average current within a predetermined current threshold value range, and a voltage exceeding rate higher than a predetermined voltage exceeding rate threshold value. Then, when the method determines that the conditions are satisfied, a condition satisfaction duration time over which the conditions are continually satisfied is calculated and, when the condition satisfaction duration time is determined to be longer than a predetermined duration time threshold value, the state of charge at that time is regarded as a state of charge at the charge acceptance limit.

CITATION LIST

Patent Literature

Patent Document 1: Japanese Unexamined Patent Application Publication No. 2010-284038

Patent Document 2: Japanese Unexamined Patent Application Publication No. 2011-163789

SUMMARY OF THE INVENTION

Problems to be Solved by the Invention

Nevertheless, the characteristics of the secondary battery when fully charged, that is, the charge acceptability of a charge current and the like when a full charge has been reached, vary significantly according to an internal state of the secondary battery, environmental conditions, and the like. For example, with a liquid lead-acid battery, concentrated sulfuric acid accumulates at the bottom during charging because of a difference in specific gravity between water and sulfuric acid, forming a concentration gradient of sulfuric acid (stratification), and the charge acceptability varies according to the degree of this stratification. Further, charge acceptability also varies according to state quantities of the secondary battery, such as capacity, fluid volume, weight, and volume, as well as the environmental temperature surrounding the secondary battery, and the like. During secondary battery operation, these factors (hereinafter referred to as "state quantities caused by variation"), either singly or in combination, greatly affect charge acceptability.

In this regard, the methods for detecting the state of charge when the secondary battery is fully charged described in Patent Documents 1 and 2 do not consider the impact caused by the above-described factors in the process for determining a full charge whatsoever. As a result, when a full charge has been determined by the methods for determining a full charge described in Patent Documents 1 and 2, the problem arises that the secondary battery may already be overcharged or may not have reached a full charge.

Hence, the present invention is designed to solve these problems, and therefore it is an object of the present invention to provide a state detecting method and a state detecting device of a secondary battery that correct the impact of state quantities caused by variation and calculate the state of charge with high accuracy, and more specifically, detect that the secondary battery has reached a chargeable upper limit and estimate the state of charge at a full charge.

Means to Solve the Problem

According to a first aspect of a state detecting method of a secondary battery of the present invention, the state detecting method includes a voltage acquiring step of acquiring a detected voltage value, a current acquiring step of acquiring a detected current value, a state quantities caused by variation acquiring step of acquiring at least one of state quantities caused by variation that impacts estimation or detecting conditions of a state of charge of the secondary battery, and a state of charge calculating step of determining that the secondary battery has reached a predetermined charge state and calculating the state of charge using the detected voltage value and the detected current value, the state of charge calculating step including a correcting step of making corrections using the state quantities caused by variation.

According to another aspect of the state detecting method of a secondary battery of the present invention, the state of charge calculating step includes a voltage determining step of determining that the detected voltage value has reached a predetermined voltage threshold value or greater; a current determining step of determining that the detected current value has decreased to a predetermined current threshold value or less; a state of charge estimating step of determining that a state at the voltage threshold value or greater following determination of an increase in the detected voltage value in the voltage determining step, and at the current threshold value or less following determination of a decrease in the detected current value in the current determining step has continued for a predetermined determination time; and a state of charge setting step of setting a predetermined state of charge as the state of charge when it has been determined that the state has continued for the predetermined determination time or greater in the state of charge estimating step; the correcting step of correcting the state of charge set in the state of charge setting step using the state quantities caused by variation.

According to another aspect of the state detecting method of a secondary battery of the present invention, the correcting step corrects the predetermined state of charge set in the state of charge setting step using a correction formula having predetermined correcting parameters determined using the state quantities caused by variation.

According to another aspect of the state detecting method of a secondary battery of the present invention, the state of charge calculating step includes a voltage determining step of determining that the detected voltage value has reached a predetermined voltage threshold value or greater; a current determining step of determining that the detected current value has decreased to a predetermined current threshold value or less; a state of charge estimating step of determining that a state at the voltage threshold value or greater following determination of an increase in the detected voltage value in the voltage determining step, and at the current threshold value or less following determination of a decrease in the detected current value in the current determining step has continued for a predetermined determination time; and a state of charge setting step of setting a predetermined state of charge as the state of charge when it has been determined that the state has continued for the predetermined determination time or greater in the state of charge estimating step; the correcting step of correcting the current threshold value using the state quantities caused by variation.

According to another aspect of the state detecting method of a secondary battery of the present invention, the predetermined charge state is a full charge state.

According to another aspect of the state detecting method of a secondary battery of the present invention, the correcting step corrects the current threshold value used in the current determining step using a correction formula having predetermined correcting parameters determined using the state quantities caused by variation.

According to another aspect of the state detecting method of a secondary battery of the present invention, the state quantities caused by variation include at least one of a temperature, stratification degree, internal resistance, battery capacity, and battery size of the secondary battery.

According to a first aspect of a state detecting device of a second battery of the present invention, the state detecting device includes voltage acquiring means for acquiring a detected voltage value of the secondary battery, state quantities caused by variation acquiring means for acquiring at least one of state quantities caused by variation that impacts estimation of a state of charge or detection of a charge state of the secondary battery, and a state of charge calculating unit that determines that the secondary battery has reached a predetermined state of charge and calculates a state of charge using the detected voltage value and the detected current value acquired by the voltage acquiring means and the current acquiring means, the state of charge calculating unit including correcting means for making corrections using the state quantities caused by variation.

According to another aspect of the state detecting device of a secondary battery of the present invention, the state of charge calculating unit includes voltage determining means for determining that the detected voltage value has reached a predetermined voltage threshold value or greater; current determining means for determining that the detected current value has decreased to a predetermined current threshold value or less; state of charge estimating means for determining that a state at the voltage threshold value or greater following determination of an increase in the detected voltage value by the voltage determining step, and at the current threshold value or less following determination of a decrease in the detected current value by the current determining means has continued for a predetermined determination time; and state of charge setting means for setting a predetermined state of charge as the state of charge when it has been determined that the state has continued for the determination time or greater by the state of charge estimating means; the correcting means for correcting the state of charge set in the state of charge setting means using the state quantities caused by variation.

According to another aspect of the state detecting device of a secondary battery of the present invention, the state of charge calculating unit includes voltage determining means for determining that the detected voltage value has reached a predetermined voltage threshold value or greater; current determining means for determining that the detected current value has decreased to a predetermined current threshold value or less; state of charge estimating means for determining that a state at the voltage threshold value or greater following determination of an increase in the detected voltage value by the voltage determining means, and at the current threshold value or less following determination of a decrease in the detected current value by the current determining means has continued for a predetermined determination time; and state of charge setting means for setting a predetermined state of charge as the state of charge when it has been determined that the state has continued for determination time or greater by the state of charge estimating means; the correcting means for correcting the current threshold value using the state quantities caused by variation.

According to another aspect of the state detecting device of a secondary battery of the present invention, the predetermined charge state is a full charge state.

Effect of the Invention

According to the present invention, it is possible to provide the state detecting method and the state detecting device of the secondary battery that correct the impact of state quantities caused by variation and calculate the state of charge with high accuracy.

DETAILED DESCRIPTION OF PREFERRED EMBODIMENTS

THE FOLLOWING DESCRIBES IN DETAIL THE STATE DETECTING METHOD AND STATE DETECTING DEVICE OF PREFERRED EMBODIMENTS OF THE PRESENT INVENTION WITH REFERENCE TO DRAWINGS.

It should be noted that each component having the same function is denoted using the same reference numbers for the simplicity of illustrations and descriptions.

First Embodiment

Figure 1:
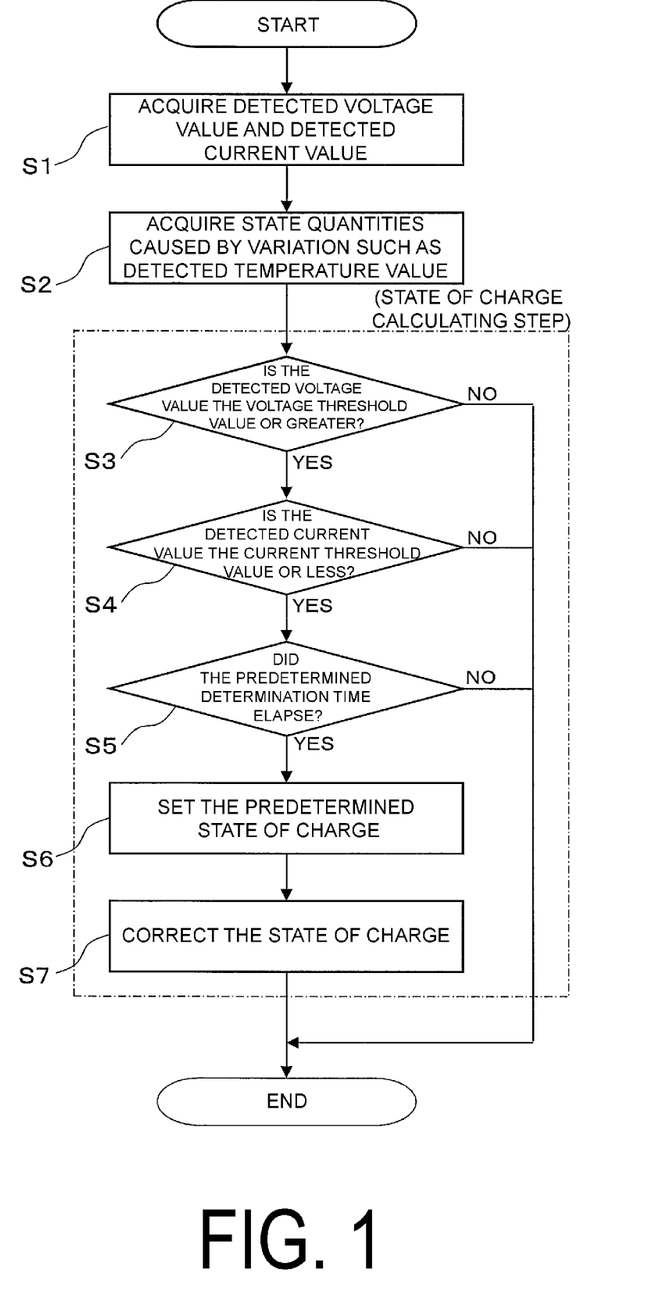
FIG. 1 is a flowchart describing the processing flow of a state detecting method according to a first embodiment of the present invention.
Figure 2A:
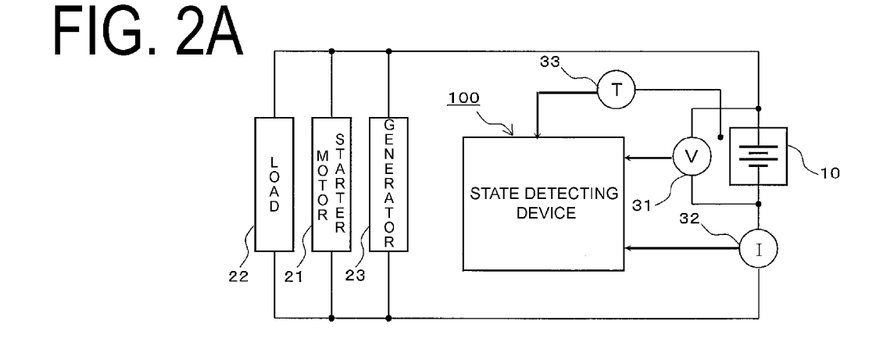
FIGS. 2A and 2B are block diagrams illustrating the configuration of a state detecting device according to the first embodiment of the present invention.
Figure 2B:
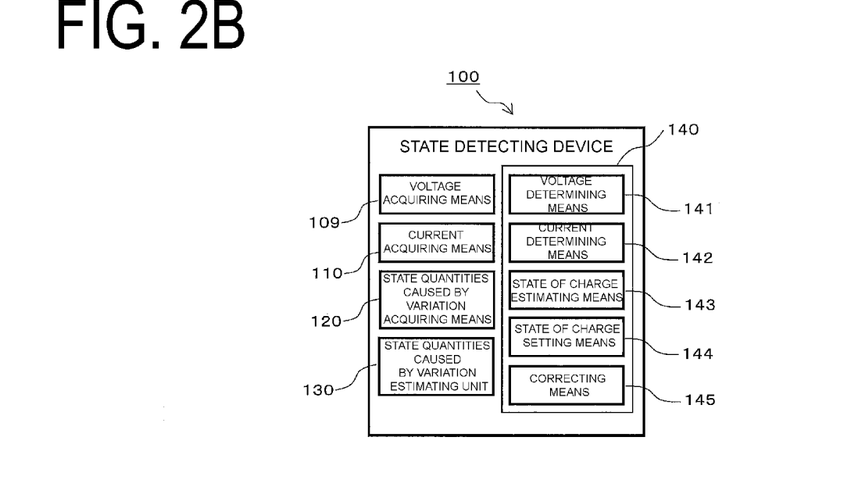

The state detecting method and the state detecting device of a secondary battery according to a first embodiment of the present invention will now be described using FIGS. 1 to 2B. FIG. 1 is a flowchart describing the processing flow of the state detecting method of the secondary battery of the present embodiment. Further, FIGS. 2A and 2B are block diagrams illustrating the configuration of the state detecting device 100 of the secondary battery of the present embodiment.

The state detecting method and the state detecting device of the secondary battery of the present embodiment determine whether or not the secondary battery has reached a predetermined charge state, more specifically, a full charge, and calculate with high accuracy the state of charge in the charge state at the time of determination, or detect with high accuracy whether or not the secondary battery has reached a predetermined charge state, more specifically, a full charge, during a process of charging the secondary battery. According to the present embodiment, the secondary battery is charged by a conventional charging method.

Figure 3A:
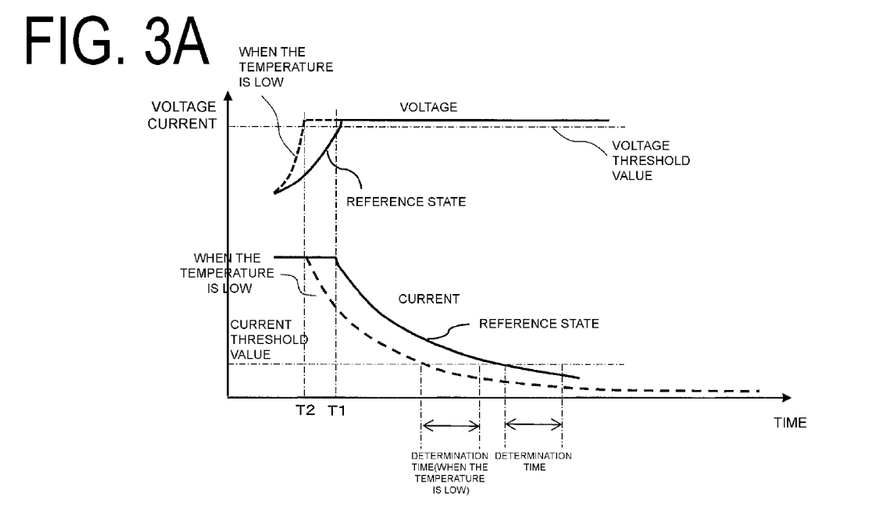
FIGS. 3A and 3B are graphs showing an example of variation in voltage and current in a conventional charging method of a secondary battery.

In the conventional charging method of the secondary battery, as illustrated in FIG. 3A, a constant current charge having a charge current that is substantially constant is conducted until a terminal voltage reaches a predetermined voltage value after charging is started (to the time of T1 in FIG. 3A). After T1, when the terminal voltage reached the predetermined voltage value, the charge is switched to a constant voltage charge that conducts charging at a substantially constant terminal voltage. Once charging is switched to the constant voltage charge, conventionally, the charge current decreases as the charge approaches a full charge. Then, when the charge current decreases to a predetermined current value (current threshold value), a duration time of the charge current being a current threshold value or less is obtained, and it is determined that the secondary battery has reached a predetermined state when this duration time reaches a predetermined time (determination time).

When the secondary battery is in a predetermined reference state, the state of charge when the above-described full charge is determined is 100%. Nevertheless, when the secondary battery is not in the reference state, the state of charge is not necessarily 100% even if a full charge is determined by the above-described method. For example, in a low temperature range, the terminal voltage and charge current of the secondary battery exhibit behavior such as when the temperature is low in FIG. 3A. As a result, when the state of charge is determined using the same current threshold value as the reference state, the determined state of charge is less than the reference state. Hereinafter, factors that determine whether or not the secondary battery is in the reference state will be referred to as state quantities caused by variation. When such state quantities caused by variation vary from values in the reference state, the state quantities impact the charge acceptability of the secondary battery.

In a liquid lead-acid battery, concentrated sulfuric acid accumulates at the bottom of the battery interior during charging because of a difference in specific gravity between the water and sulfuric acid, forming a layer of sulfuric acid (stratification), and the charge acceptability varies according to the degree of this stratification. Further, the charge acceptability also varies according to the capacity, fluid volume, weight, volume, and the like of the secondary battery. Furthermore, the temperature of the secondary battery or surrounding area also significantly impacts the charge acceptability. Accordingly, during operation of the secondary battery, these factors, either singly or in combination, impact the state of charge when the predetermined charge state, more specifically, a full charge is determined.

As described above, the state quantities caused by variation that change the charge acceptability of the secondary battery and impact the state of charge may include temperature, stratification degree, internal resistance, battery capacity, and battery size, such as fluid volume, weight, and volume.

According to the state detecting method and the state detecting device of a secondary battery of the present embodiment, when a predetermined determination time has elapsed after the moment the battery voltage has reached a voltage threshold value and the charge current has decreased to a current threshold value, the state detecting method and the state detecting device determine that the secondary battery has reached a predetermined state of charge such as a full charge, for example. At this time, when the secondary battery is in a reference state and a full charge determination has been performed, the state of charge at the full charge is estimated to be 100%. In contrast, when the secondary battery is not in the reference state, the possibility exists that the state of charge when the above-described full charge is determined is not 100%. Hence, according to the present embodiment, the state of charge when the state detecting method and the state detecting device determine a predetermined charge state is corrected using the state quantities caused by variation. If a full charge is determined and the secondary battery is not in the reference state, the temperature, as one of state quantities caused by variation, for example, varies from a reference temperature (or reference temperature range) and the 100% rate of charge is corrected on the basis of an amount of variation from the reference temperature.

The configuration of the state detecting device 100 of a secondary battery of the present embodiment will now be described using FIGS. 2A and 2B. While the following describes an example of a case where the state detecting device 100 of the present embodiment is applied to a secondary battery mounted to a vehicle, the present invention is naturally not limited thereto and the state detecting device 100 of the present embodiment may be applied to a secondary battery of an object other than a vehicle. FIG. 2A illustrates the configuration for detecting the state of a secondary battery by the state detecting device 100 of the present embodiment, and FIG. 2B illustrates the detailed configuration of the state detecting device 100 of the present embodiment.

In FIG. 2, a starter motor 21 for starting an engine and a load 22 of lights and the like are connected to a secondary battery 10 mounted to a vehicle. Further, a generator 23 for charging the secondary battery 10 is also connected. Furthermore, a voltage detecting unit 31 for detecting voltage, a current detecting unit 32 for detecting current, and a temperature detecting unit 33 for detecting temperature are provided to the secondary battery 10. The temperature detecting unit 33 detects a surface temperature or ambient temperature of the secondary battery 10 as the temperature thereof.

The state detecting device 100 of the present embodiment includes at least voltage acquiring means 109, current acquiring means 110, and state quantities caused by variation acquiring means 120 as means for acquiring state quantities of the secondary battery 10. The voltage acquiring means 109 acquire a detected voltage value from the voltage detecting unit 31. The current acquiring means 110 acquire a detected current value from the current detecting unit 32. Further, the state quantities caused by variation acquiring means 120 are means for acquiring state quantities caused by variation of the secondary battery 10, and acquiring a detected temperature value of the secondary battery 10 from the temperature detecting unit 33, for example.

Applicable state quantities caused by variation other than temperature include data such as the stratification degree, capacity, fluid volume, weight, and volume of the secondary battery 10. The state quantities caused by variation other than temperature are difficult to directly measure using a sensor or the like, and thus a state quantities caused by variation estimating unit 130 that estimates these state quantities may be provided. The state quantities caused by variation estimating unit 130 may be configured to estimate the state quantities caused by variation using a table, evaluation formula, or the like created and set up in advance, for example.

For example, data such as the capacity, weight, and volume of the battery may be acquired from the actual vehicle. Further, for a variation in the battery fluid volume, the amount of variation caused by an amount of evaporation or the like may be calculated on the basis of a table, evaluation formula, or the like. The stratification degree may be calculated on the basis of temperature, charge capacity, electric discharge capacity, and the like.

The state detecting device 100 of the present embodiment is capable of starting operation at the same time as the charging of the secondary battery 10 is started. Or, the state detecting device 100 may start operation after the constant current charge is completed and the constant voltage charge is started. The processing of state detection by the state detecting device 100 is performed in a predetermined detecting period, from the start of operation to determination of one of a full charge and predetermined state of charge. Each detecting period, the detected voltage value acquired by the voltage acquiring means 109, the detected current value acquired by the current acquiring means 110 and the state quantities caused by variation acquired by the state quantities caused by variation acquiring means 120 are input to a state of charge calculating unit 140.

The state of charge calculating unit 140 includes voltage determining means 141, current determining means 142, state of charge estimating means 143, state of charge setting means 144, and correcting means 145. The current determining means 142 acquire the detected current value from the current acquiring means 110, and compares the value with a predetermined current threshold value set in advance. Then, the current determining means 142 output the result of determining whether or not the detected current value is the current threshold value or less to the state of charge estimating means 143.

The state of charge estimating means 143 acquire the determination result of whether or not the detected voltage value has reached the voltage threshold value or greater from the voltage determining means 141, and the determination result of whether or not the detected current value is the current threshold value or less from the current determining means 142 and, when the detected current value is the current threshold value or less, the state of charge estimating means 143 calculate the duration time from when it is the current threshold value or less. Then, the state of charge estimating means 143 compare the calculated duration time with the predetermined determination time set in advance and, when the calculated duration time is the determination time or greater, determines that the secondary battery 10 has reached the predetermined state of charge and executes the state of charge setting means 144.

If a full charge is to be determined, the state of charge setting means 144 set the state of charge at a full charge of the secondary battery 10 when the secondary battery 10 is in the reference state as the state of charge at a full charge. Because the state of charge at a full charge of the secondary battery 10 is estimated to be 100% in the reference state, the state of charge setting means 144 set 100% as the state of charge at a full charge, for example, and outputs this to the correcting means 145.

The correcting means 145 acquire a predetermined state of charge in the reference state from the state of charge setting means 144 as well as the state quantities caused by variation, such as temperature, from the state quantities caused by variation acquiring means 120. Then, the correcting means 145 calculate the amount of variation of the state quantities caused by variation from each value in the reference state, and correct the above-described state of charge in the reference state input from the state of charge setting means 144 on the basis of the amount of variation. With this arrangement, a state of charge that reflects the variations in the state quantities caused by variation, such as temperature, is obtained. The state of charge obtained by the correcting means 145 is displayed on a predetermined display device or the like, for example, making it possible to notify an operator and the like.

Methods for correcting the state of charge based on the amount of variation in the state quantities caused by variation include a method that uses a correction formula having correcting parameters. According to this correction method, values of the correcting parameters are determined using the state quantities caused by variation. Or, as another method for correcting the state of charge, it is also possible to create a correspondence table or the like of amount of variation from the reference state in the state quantities caused by variation and corrected state of charge values in advance, and correct the state of charge using the corrected state of charge value obtained therefrom.

The state detecting device 100 of the present embodiment can be used at the same time as the charging of the secondary battery 10 is started. Or, use of the state detecting device 100 can be started at the same time as or after the constant current charge ends and is switched to the constant voltage charge. When the state detecting device 100 is configured to acquire the detected voltage value of the secondary battery 10 from the voltage detecting unit 31, it is possible to correctly determine the switch from constant current charge to constant voltage charge using the detected voltage value. Thereby, the state detecting device 100 may also be configured to start the processing of the state of charge calculating unit 140 when the switch to the constant voltage charge is determined.

The state detecting method of a secondary battery of the present embodiment will now be further described in detail using FIG. 1. When the charging of the secondary battery 10 is started, starting state detection by the state detecting device 100 of the present embodiment, the processing of each step illustrated in FIG. 1 is performed in a predetermined detecting period. First, in step S1, the voltage acquiring means 109 acquire the detected voltage value from the voltage detecting unit 31 (voltage acquiring step), and the current acquiring means 110 acquire the detected current value from the current detecting unit 31 (current acquiring step).

Further, in step S2, the state quantities caused by variation acquiring means 120 acquire a detected temperature value from the temperature detecting unit 23, and acquires state quantities caused by variation other than the detected temperature value from the state quantities caused by variation estimating unit 130 (state quantities caused by variation acquiring step). It should be noted that the processing of step 2 may be performed when the amount of variation from the reference state in the state quantities caused by variation is calculated and the state of charge is corrected in step S6 described later.

In the next step S3 and the steps thereafter, the processing of the state of charge calculating step of calculating the state of charge of the secondary battery 10 is performed. In step S3, the voltage determining means 141 compare the detected voltage value with the voltage threshold value set in advance, and determine whether or not the detected voltage value is the voltage threshold value or greater (voltage determining step). When the determination result indicates that the detected voltage value is the voltage threshold value or greater, the flow advances to step 4. When it indicates that the detected voltage value is less than the voltage threshold value, the processing of the detecting period is terminated. In step S4, the current determining means 142 compare the detected current value with the current threshold value set in advance, and determine whether or not the detected current value is the current threshold value or less (current determining step). When the determination result indicates that the detected current value is the current threshold value or less, the flow advances to step S5. When it indicates that the detected current value is greater than the current threshold value, the processing of the detecting period is terminated.

In step S5, the state of charge estimating means 143 calculate the duration time from when the detected voltage value is the voltage threshold value or greater and the detected current value is the current threshold value or less. The duration time may be calculated by, for example, continually adding the duration of the detecting period per period starting from the detecting period when it is first determined that the detected voltage value is the voltage threshold value or greater in step S3 and the detected current value is the current threshold value or less in step S4. Or, the duration time may be calculated by storing the time when it is first determined that the detected voltage value is the voltage threshold value or greater in step S3 and the detected current value is the current threshold value or less in step S4, and then calculating the duration time from this and the time of each period.

In step S5, the state of charge estimating means 143 determine whether or not the determination time has elapsed since the detected current value first became the current threshold value or less by further comparing the duration time with the predetermined determination time after calculating the duration time (state of charge estimating step). Then, when step S5 determines that the predetermined determination time has elapsed, the flow advances to step S6. When step S5 determines that the determination time has not elapsed, the processing of the detecting period is terminated.

In step S6, the state of charge setting means 144 set the predetermined state of charge in the reference state as the state of charge of the secondary battery 10 (state of charge setting step).

In step S7, the correcting means 145 acquire the state of charge in the reference state set in step S6 and the state quantities caused by variation such as temperature from the state quantities caused by variation estimating unit 130. Then, the correcting means 145 calculate the amount of variation from the reference state in the state quantities caused by variation, and correct the state of charge in the reference state on the basis of the amount of variation (correcting step). Thereby, a state of charge that reflects the variation in state quantities caused by variation, such as temperature, is obtained.

According to the state detecting method and state detecting device of a secondary battery of the present embodiment, it is possible to calculate the state of charge of the secondary battery with high accuracy by correcting the state of charge on the basis of the amount of variation in the state quantities caused by variation.

Second Embodiment

Figure 4:
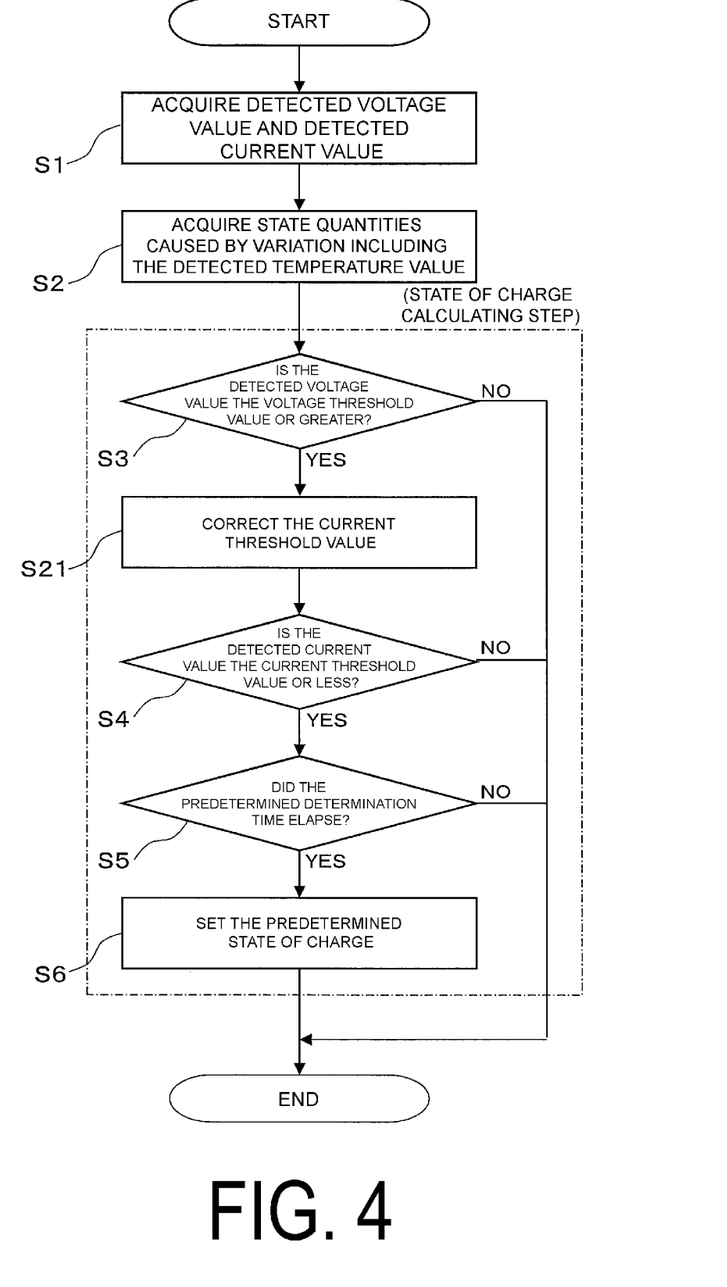
FIG. 4 is a flowchart describing the processing flow of a state detecting method according to a second embodiment of the present invention.

The state detecting method and the state detecting device of a secondary battery according to a second embodiment of the present invention will now be described using FIGS. 4 and 5. FIG. 4 is a flowchart describing the processing flow of the state detecting method of a secondary battery of the present embodiment. Further, FIG. 5 is a block diagram illustrating the configuration of a state detecting device 200 of a secondary battery of the present embodiment.

The state detecting method and the state detecting device 200 of the first embodiment are configured to correct the state of charge when a predetermined state of charge has been determined, on the basis of the amount of variation in state quantities caused by variation. In contrast, the state detecting method and the state detecting device of the present embodiment are configured to correct the current threshold value used to determine the charge state, on the basis of the amount of variation in the state quantities caused by variation.

Figure 5:
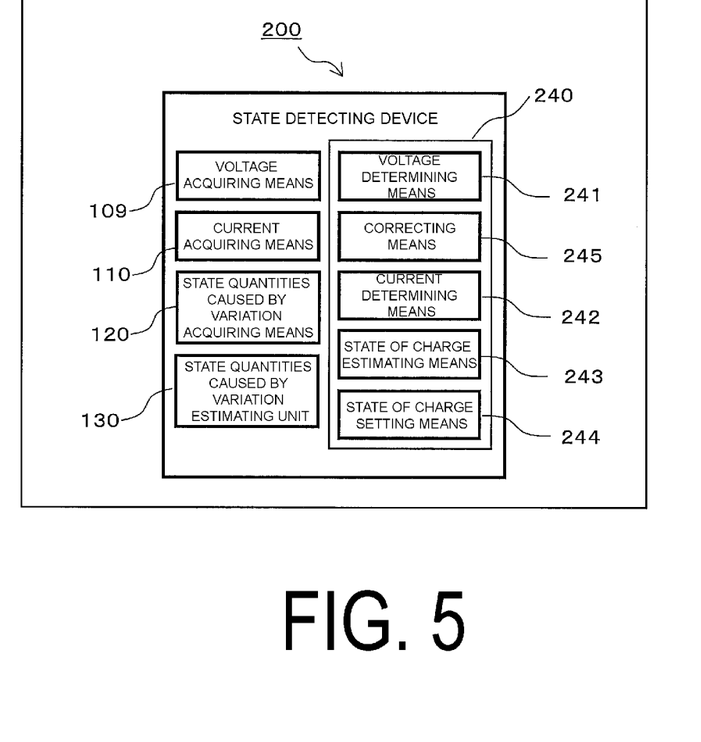
FIG. 5 is a block diagram illustrating the configuration of a state detecting device according to the second embodiment of the present invention.

According to the state detecting device 200 of the present embodiment illustrated in FIG. 5, correcting means 245 correct the current threshold value on the basis of the amount of variation in the state quantities caused by variation, and outputs the corrected current threshold value to current determining means 242. The current determining means 242 compare the detected current value input from the current acquiring means 110 with a current threshold value after correction input from the correcting means 245. Then, the current determining means 242 output the result of determining whether or not the detected current value is the current threshold value or less after correction to state of charge estimating means 243.

The state of charge estimating means 243, similar to the first embodiment, calculate the duration time from when the detected voltage value is the voltage threshold value or greater and the detected current value is the current threshold value or less after correction. Then, when the calculated duration time is the determination time or greater, the state of charge estimating means 243 determine that the secondary battery 10 has reached the predetermined charge state and execute state of charge setting means 244. The state of charge setting means 244 set the predetermined state of charge in the reference state set in advance as the state of charge.

While the state of charge set by the state of charge setting means 243 is set in advance as the state of charge in the reference state, this state of charge is not corrected in the present embodiment. Instead, according to the present embodiment, the state of charge in the reference state is achieved by suitably correcting the current threshold value used to determine the charge state.

Methods for correcting the current threshold value based on the amount of variation in the state quantities caused by variation by the correcting means 245 include a method of using a correction formula having correcting parameters. According to this correction method, values of the correcting parameters are determined using the state quantities caused by variation. Or, as another method for correcting the current threshold value, it is possible to create a correspondence table or the like of the amount of variation from the reference state in the state quantities caused by variation and the current threshold value, and correct the current threshold value using a corrected value found therefrom.

The following describes the state detecting method of a secondary battery of the present embodiment using FIG. 4. According to the present embodiment, step S21 is added following step S3, which is the same as the first embodiment, and the current threshold value is corrected in step S21 (correcting step). In the next step S4, similar to the first embodiment, whether or not the detected current value is the current threshold value or less is determined, but the current threshold value used here is the current threshold value corrected in step S21. Hereafter, similar to the first embodiment, when step S5 determines that the duration time has elapsed the determination time after the detected voltage value has become the voltage threshold value or greater (step S3) and the detected current value has become the current threshold value or less (step S4), the state of charge in the reference state is set as the state of charge in step S6.

Third Embodiment

Figure 6:
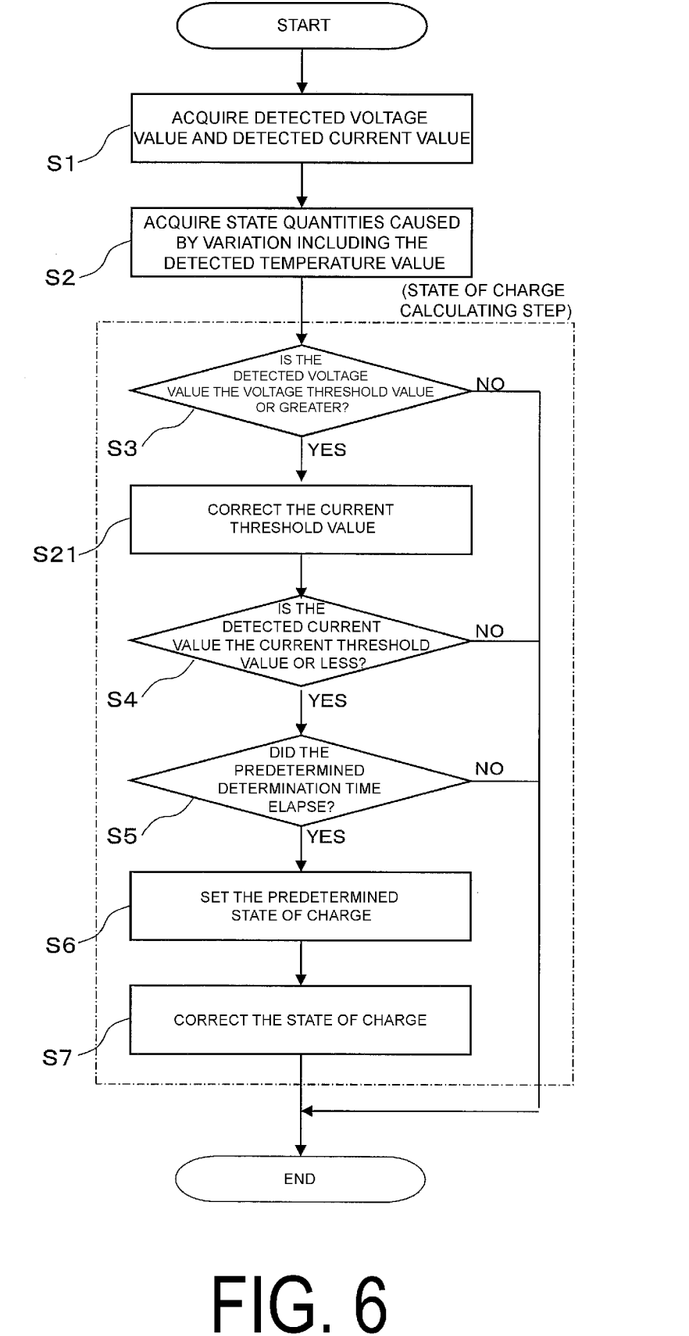
FIG. 6 is a flowchart describing the processing flow of a state detecting method according to a third embodiment of the present invention.

The state detecting method and the state detecting device of a secondary battery according to a third embodiment of the present invention will now be described using FIGS. 6 and 7. FIG. 6 is a flowchart describing the processing flow of the state detecting method of a secondary battery of the present embodiment. Further, FIG. 7 is a block diagram illustrating the configuration of a state detecting device 300 of a secondary battery of the present embodiment.

Figure 7:
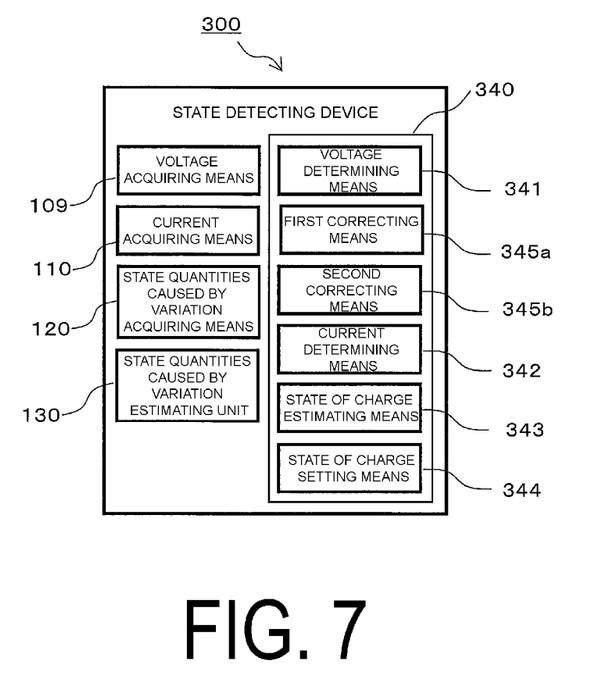
FIG. 7 is a block diagram illustrating the configuration of a state detecting device according to the third embodiment of the present invention.

The state detecting device 300 of the present embodiment illustrated in FIG. 7 includes correcting means (first correcting means) 345*a* that corrects a state of charge in the reference state in the same manner as the first embodiment, as well as correcting means (second correcting means) 345*b* that corrects the current threshold value in the same manner as the second embodiment. Thereby, a state of charge when it has been determined in a predetermined charge state by voltage determining means 341, current determining means 342, state of charge estimating means 343, and state of charge setting means 344 using a current threshold value corrected by the second correcting means 345*b* can be further corrected using the first correcting means 345*a*, making it possible to find the state of charge with even higher accuracy.

Further, according to the state detecting method in the present embodiment illustrated in FIG. 6, step 21 for correcting the current threshold value is provided between step S3 and step S4 in the same manner as the second embodiment, and the state of charge is corrected in step S7 following step S6 in the same manner as the first embodiment. Thereby, it is possible to find the state of charge with high accuracy.

Figure 3B:
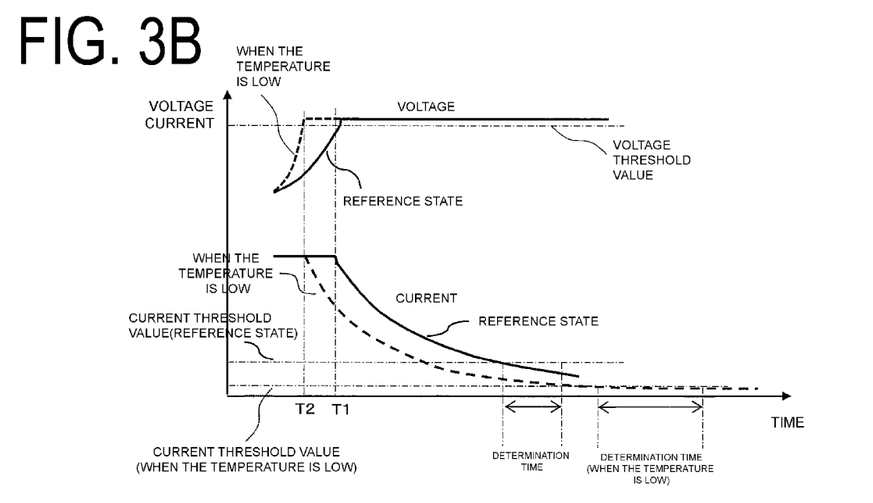

In the present embodiment, detecting conditions can be suitably corrected in accordance with the state quantities caused by variation. For example, as illustrated in FIG. 3B, to obtain a full or nearly full charge when the temperature is low, charging for a long period of time at a low current is required because the state of charge is determined at the current threshold value (when the temperature is low) illustrated in the same figure. Nevertheless, when an actual operating environment is considered, obtaining such a charging environment is not easy due to time restrictions. For this reason, determining the state of charge in a relatively short period of time is required. In order to determine the state of charge in a short charging time when the temperature is low, a current threshold value that serves as a determination reference may be set as a current value of a low state of charge, such as the current threshold value in FIG. 3A, for example. That is, any state of charge during charging can be obtained using a correspondence table or the like of state quantities caused by variation with respect to current values and the state of charge.

It should be noted that while these embodiments describe examples of the state detecting method and state detecting device of a secondary battery according to the present invention, the present invention is not limited thereto. The configuration of the details, the detailed operation, and the like of the state detecting method and the state detecting device of a secondary battery of these embodiments may be suitably changed without deviating from the spirit and scope of the present invention.

REFERENCE NUMBER

10 Secondary battery
21 Starter motor
22 Load
23 Generator
31 Voltage detecting unit
32 Current detecting unit
33 Temperature detecting unit
100, 200, 300 State detecting device
110 Current acquiring means
120 State quantities caused by variation acquiring means
130 State quantities caused by variation estimating unit
140, 240, 340 state of charge calculating unit
141, 241, 341 Voltage determining means
142, 242, 342 Current determining means
143, 243, 343 state of charge estimating means
144, 244, 344 state of charge setting means
145, 245, 345*a*, 345*b* Correcting means

What is claimed is:

1. A state detecting method of a secondary battery, comprising the steps of:
   a voltage acquiring step of acquiring a detected voltage value while the secondary battery is being charged;
   a current acquiring step of acquiring a detected current value;
   a state of acquiring quantities caused by variation a temperature and at least one of state quantities caused by variation that impact a state of charge of the secondary battery, at least one of the state quantities being selected from a group consisting of a stratification degree, battery capacity, battery fluid volume, battery weight and battery volume; and
   a state of charge calculating step of determining that the secondary battery has reached a predetermined charge state and calculating the state of charge, using the detected voltage value and the detected current value;
   the state of charge calculating step comprising a correcting step of making corrections using a combination of the state quantities caused by variation and the temperature.

2. The state detecting method of the secondary battery according to claim 1, wherein
   the state of charge calculating step comprises:
   a voltage determining step of determining that the detected voltage value has reached a predetermined voltage threshold value or greater;
   a current determining step of determining that the detected current value has decreased to a predetermined current threshold value or less;
   a state of charge estimating step of determining that a state at the predetermined voltage threshold value or greater following determination of an increase in the detected voltage value in the voltage determining step, and at the predetermined current threshold value or less following determination of a decrease in the detected current value in the current determining step has continued for a predetermined determination time; and
   a state of charge setting step of setting the predetermined charge state as the state of charge upon the state at the predetermined voltage threshold value or greater following determination of an increase in the detected voltage value in the voltage determining step, and at the predetermined current threshold value or less following determination of a decrease in the detected current value in the current determining step has continued for the predetermined determination time or greater in the state of charge estimating step; and
   the correcting step corrects the state of charge set in the state of charge setting step using the combination of the state quantities caused by variation and the temperature.

3. The state detecting method of the secondary battery according to claim 2, wherein
   the correcting step corrects the state of charge set in the state of charge setting step using a correction formula having predetermined correcting parameters determined using the combination of the state quantities caused by variation and the temperature.

4. The state detecting method of the secondary battery according to claim 1, wherein
   the state of charge calculating step comprises:
   a voltage determining step of determining that the detected voltage value has reached a predetermined voltage threshold value or greater;
   a current determining step of determining that the detected current value has decreased to a predetermined current threshold value or less;
   a state of charge estimating step of determining a charge state by a state at the predetermined voltage threshold value or greater following determination of an increase in the detected voltage value in the voltage determining step, and at the predetermined current threshold value or less following determination of a decrease in the detected current value in the current determining step having continued for a predetermined determination time; and
   a state of charge setting step of setting the predetermined charge state as the state of charge upon the state at the predetermined voltage threshold value or greater following determination of an increase in the detected voltage value in the voltage determining step, and at the predetermined current threshold value or less following determination of a decrease in the detected current value in the current determining step having continued for the predetermined time or greater in the charging estimating step; and
   the correcting step corrects the current threshold value using the combination of the state quantities caused by variation and the temperature.

5. The state detecting method of the secondary battery according to claim 1, wherein
   the predetermined charge state is a full charge state.

6. The state detecting method of the secondary battery according claim 4, wherein
   the correcting step corrects the predetermined current threshold value using a correction formula having predetermined correcting parameters determined using the combination of the state quantities caused by variation and the temperature.

7. A state detecting device of a secondary battery, comprising:
   voltage acquiring means for acquiring a detected voltage value of the secondary battery;
   current acquiring means for acquiring a detected current value of the secondary battery;
   state quantities caused by variation acquiring means for acquiring a temperature and at least one of state quantities caused by variation that impact a state of charge of the secondary battery; and
   a state of charge calculating unit that determines that the secondary battery has reached a predetermined charge state and calculates the state of charge using the detected voltage value and the detected current value acquired by the voltage acquiring means and the current acquiring means;
   the state of charge calculating unit comprising correcting means for making corrections using a combination of the temperature and the state quantities caused by variation, at least one of the state quantities being selected from a group consisting of a stratification degree, battery capacity, battery fluid volume, battery weight and battery volume.

8. The state detecting device of the secondary battery according to claim 7, wherein
   the state of charge calculating unit comprises:
   voltage determining means for determining that the detected voltage value has reached a predetermined voltage threshold value or greater;
   current determining means for determining that the detected current value has decreased to a predetermined current threshold value or less;

state of charge estimating means for determining that a state at the predetermined voltage threshold value or greater following determination of an increase in the detected voltage value by the voltage determining means, and at the predetermined current threshold value or less following determination of a decrease in the detected current value by the current determining means has continued for a predetermined determination time; and state of charge setting means for setting the predetermined charge state as the state of charge upon the state of charge estimating means determining that the state at the predetermined voltage threshold value or greater following determination of an increase in the detected voltage value by the voltage determining means, and at the predetermined current threshold value or less following determination of a decrease in the detected current value by the current determining means has continued for the predetermined determination time or greater; and the correcting means correct the state of charge set by the state of charge setting means using the combination of the state quantities caused by variation and the temperature.

9. The state detecting device of the secondary battery according to claim 7, wherein the state of charge calculating unit comprises:

voltage determining means for determining that the detected voltage value has reached the predetermined voltage threshold value or greater;

current determining means for determining that the detected current value has decreased to the predetermined current threshold value or less;

state of charge estimating means for determining that a charge state determined by the voltage determining means and the current determining means has continued for the predetermined determination time; and state of charge setting means for setting the predetermined charge state as the state of charge upon the state of charge estimating means determining that the predetermined determination time has continued; and the correcting means correct the predetermined current threshold value using the combination of the state quantities caused by variation and the temperature.

10. The state detecting device of the secondary battery according to claim 7, wherein the predetermined charge state is a full charge state.

11. A state detecting device of a secondary battery, comprising:

a voltage acquiring unit for acquiring a detected voltage value while the secondary battery is being charged;

a current acquiring unit for acquiring a first detected current value;

a state quantity acquiring unit for acquiring at least one of state quantities caused by variation that impact a state of charge of the secondary battery; and a state of charge calculating unit for calculating the state of charge using the detected voltage value and the first detected current value for determining that the secondary battery has reached a predetermined charge state, the state of charge calculating unit performing the tasks of:

determining that the detected voltage value is at least a predetermined voltage threshold value;

determining that the first detected current value is at most a predetermined current threshold value;

determining that a predetermined time has elapsed after it has been determined that the detected voltage value is at least the predetermined voltage threshold value and that the detected current value is at most the predetermined current threshold value;

setting the state of charge to a predetermined desired charge level after it has been determined that the predetermined time has elapsed to provide a desired state of charge;

correcting the desired state of charge using the state quantities caused by variation to provide a corrected sate of charge;

correcting the predetermined current threshold value that corresponds the desired state of charge using the state quantities caused by variation to provide a corrected predetermined current threshold value;

acquiring a second detected current value from the current acquiring unit; and determining that the second detected current value is at most the corrected current threshold value.

* * * * *